United States Patent [19]

Pricer et al.

[11] 3,979,734
[45] Sept. 7, 1976

[54] MULTIPLE ELEMENT CHARGE STORAGE MEMORY CELL

[75] Inventors: Wilbur David Pricer, Burlington; James Earl Selleck, Middlebury, both of Vt.

[73] Assignee: International Business Machines Corporation, Armonk, N.Y.

[22] Filed: June 16, 1975

[21] Appl. No.: 587,528

[52] U.S. Cl. .......................... 340/173 CA; 307/238
[51] Int. Cl.² ......................................... G11C 11/40
[58] Field of Search... 340/173 CA, 173 R, 173 DR; 307/238, 279; 357/34, 36, 7, 14

[56] References Cited
UNITED STATES PATENTS

| | | | |
|---|---|---|---|
| 3,582,909 | 6/1971 | Booher | 340/173 CA |
| 3,614,749 | 10/1971 | Radcliffe, Jr. | 307/238 X |
| 3,838,405 | 9/1974 | Arnett et al. | 307/238 X |
| 3,906,296 | 9/1975 | Maserjian et al. | 307/238 X |

Primary Examiner—Thomas A. Robinson
Attorney, Agent, or Firm—Howard J. Walter, Jr.

[57] ABSTRACT

An integrated circuit memory system includes capacitive storage memory cells capable of storing $n$ bits of information on $n$ capacitors associated with multiple emitters of a bilaterally conductive bipolar transistor. Each capacitor is coupled to a separate bit/sense line. Access of a storage cell is achieved by forward biasing the common base/collector junction of the bipolar transistor. Writing is achieved by driving the bit/sense lines to charge or discharge the storage capacitors during an access cycle. In reading, or sensing, the charged state of each storage capacitor is determined by sensing potential changes on the bit/sense lines during access. Fabrication of memory arrays is possible by any one of several different techniques, all of which are compatible with high speed bipolar logic circuits.

25 Claims, 16 Drawing Figures

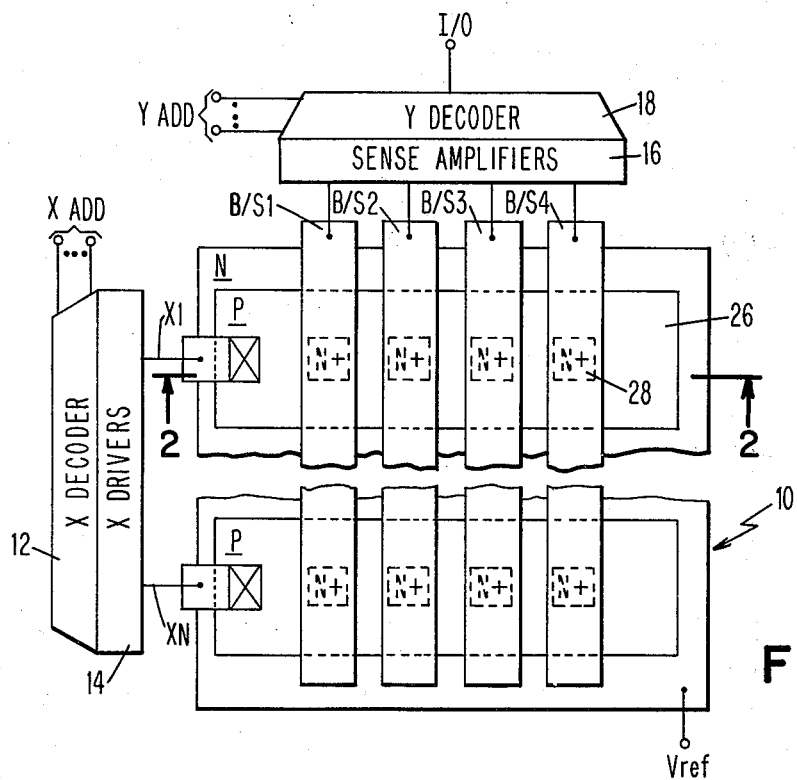
FIG. 1
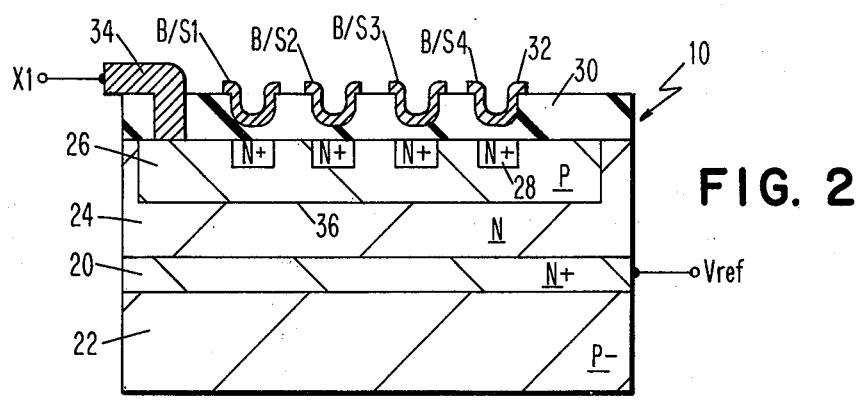
FIG. 2
FIG. 3
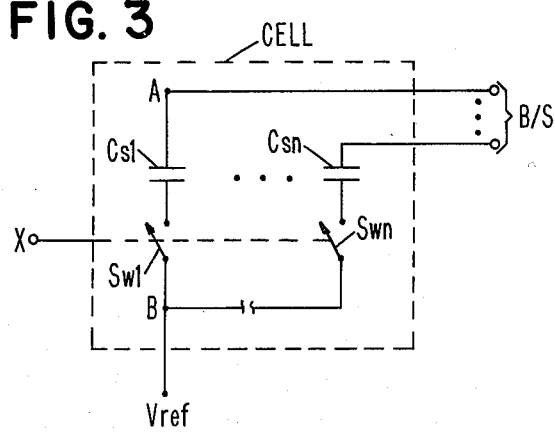
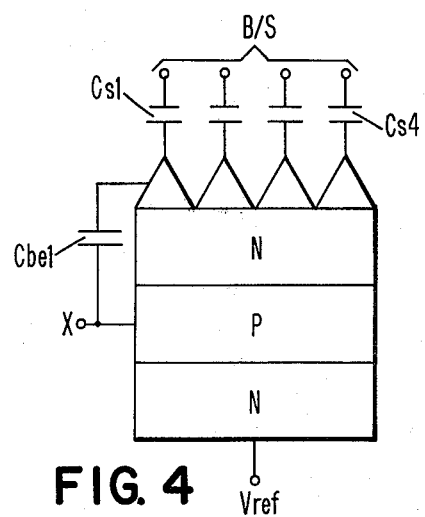
FIG. 4

MULTIPLE ELEMENT CHARGE STORAGE MEMORY CELL

BACKGROUND OF THE INVENTION

1. Field of the Invention

This invention relates to information storage systems and particularly to integrated capacitive storage systems.

2. Description of the Prior Art

Designers of memory systems used in data processing systems have long been aware of the potential of utilizing small capacitors to store binary information. Most of the previously described capacitive storage systems have failed to meet with expected commercial success in view of certain processing or circuit complexity limitations inherently found in the systems.

U.S. Pat. No. 2,828,447, entitled, "Neon Capacitor Memory System," issued Mar. 25, 1958, to J. W. Mauchly, teaches the use of a memory storage matrix which includes memory cells comprising a capacitor and a bilateral conducting neon gas tube. Information is stored on a plurality of capacitors directly coupled to a common bit/sense line. Each gas tube acts as a threshold dependent switching element.

U.S. Pat. No. 3,196,405, entitled, "Variable Capacitance Information Storage System," issued July 20, 1965, to J. B. Gunn and assigned to the assignee of the instant invention, teaches a capacitive memory system utilizing a pair of diodes, connected front-to-back, and a capacitor to form a memory cell. Although the memory provides nondestructive readout, bipolar control signals are necessary and data inversion takes place upon readout.

U.S. Pat. No. 3,553,658, entitled, "Active Storage Array Having Diodes for Storage Elements," issued Jan. 5, 1971, to W. D. Pricer and assigned to the instant assignee, teaches the use of a capacitive memory cell comprising only two back-to-back connected diodes.

The article, "Vertical Diode-Capacitor Memory Cells," W. H. Chang et al., IBM Technical Disclosure Bulletin, February 1973, pages 289–9, teaches an integrated capacitive memory cell which includes a single diode and capacitor.

Both of the last two referred to memory systems utilizing diodes have the disadvantage of requiring avalanche or reverse breakdown of the rectifying diode junction which leads to long term instability and reliability problems unless the signal voltage/drive voltage ratio of the system is reduced below optimum levels.

U.S. Pat. No. 3,387,286, entitled, "Field Effect Transistor Memory," issued June 4, 1968, to R. H. Dennard and assigned to the present assignee, describes an array of semiconductor memory cells each comprising only a single field effect transistor (FET) coupled to a storage capacitor. The FET acts as a gating element and has its drain electrode connected to a bit/sense line and its gate electrode connected to a word line. The storage capacitor is coupled between the source electrode of the FET and a reference potential. Integrated semiconductor memory chips utilizing single FET/capacitor memory cells are presently feasible which contain in excess of 16,000 binary bits and conceivably can be fabricated to the maximum limits of photo-processing technology. An inherent problem in the use of FET elements in memory cells is their comparatively slower operation than more conventional less dense multi-element bipolar memory cells.

U.S. Pat. No. 3,876,992, entitled, "Bipolar Transistor Memory with Capacitive Storage," issued Apr. 8, 1975, to W. D. Pricer, and assigned to the instant assignee, discloses an integrated memory cell comprising only a single bipolar transistor and a capacitor. Although each memory cell includes a bipolar device and its necessary isolation regions, significant improvements in density over previously known bipolar cells are achievable while retaining the inherent speed of bipolar semiconductor technology.

Another variation in the integrated capacitive storage area is taught in U.S. Pat. No. 3,676,715, entitled, "Semiconductor Apparatus for Image Sensing and Dynamic Storage," issued July 11, 1972, to S. Brojdo, which describes the use of a PN-junction diode coupled with a depletion voltage variable capacitor as a storage element. Stored information is represented by the presence or absense of carriers in a depletion region created by a field effect gate electrode. In order to write logical "1's" and "0's" into the storage cell a two step operation is necessary which undesirably causes the cycle time to be extended.

Another version of the FET/capacitor memory cell is disclosed in U.S. Pat. No. 3,705,391, entitled, "Memory System Employing Capacitance Storage Means," issued Dec. 5, 1972, to R. H. Baker, which describes the use of a plurality of independently accessible FET devices serially connected through storage capacitances to a common input/output line. The memory system is organized and operates in a similar manner to that of the Dennard reference referred to above except that one of the conducting electrodes of the FET device is connected to a source of reference potential.

In summary, although numerous variations of capacitive memory storage elements have been previously disclosed, there exists certain inherent limitations in these systems which prevents their efficient application in data processing information storage systems. And while each of the above techniques utilizes only a single active switching device and a single capacitor as a memory cell to achieve maximum density, the bipolar device versions are limited somewhat in density due to the requirement of isolation regions while the FET versions are limited in their performance. The diode/capacitor memory cells utilizing avalanche breakdown present a reliability problem.

SUMMARY OF THE INVENTION

Accordingly, it is an object of the instant invention to improve the performance and density of integrated semiconductor memory systems by providing performance and speed achievable by bipolar devices with the density maximums achievable by minimum line width requirements found in FET technologies.

In the subject invention, a single bipolar transistor having a plurality of emitter regions is used to provide a memory cell capable of supporting within a single semiconductor region an unlimited number of storage regions. Maximum density is achieved through the use of a vertically aligned storage capacitance and switching element. The memory cells of the subject invention may be integrated in various forms to provide 2D, 2½D, 3D, and N-dimensional memory system organizations.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIG. 1 is a partial schematic systems drawing of a two-dimensionally decoded embodiment of the invention.

FIG. 2 is a partial sectional view of an integrated circuit version of the memory cells of FIG. 1 and shows the vertical arrangement of a single bipolar device and a plurality of capacitive storage means.

FIG. 3 is a schematic circuit representation of the memory cell of the invention.

FIG. 4 is a circuit diagram showing a bipolar transistor embodiment of the memory cell of FIG. 3.

DESCRIPTION OF THE INVENTION

Figure 5:
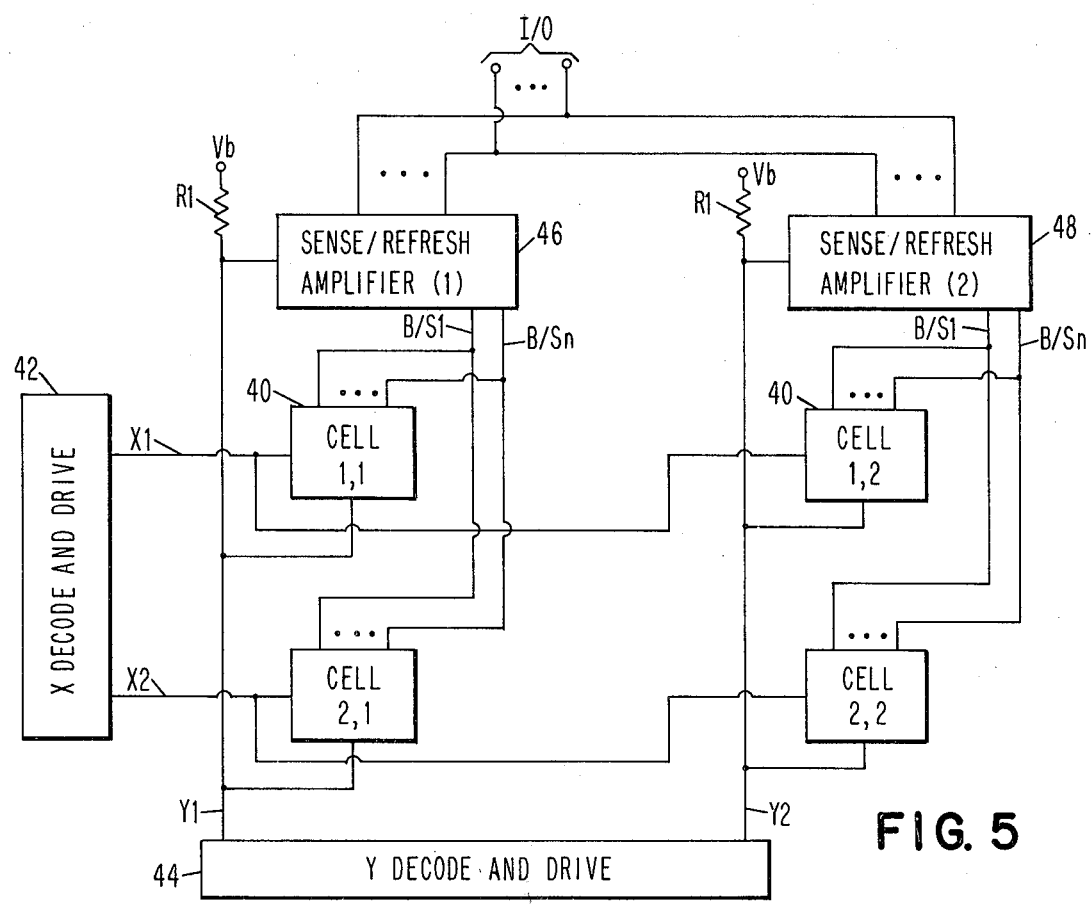
FIG. 5 is a system block diagram of a 2½D memory organization using the memory cells of FIG. 4.

Referring now to FIG. 1, there is shown a schematic representation of a memory system using the memory cells of the instant invention organized as a two-dimensionally (2D) decoded memory system. Although the memory cell array area is shown as a discrete semiconductor chip 10, those skilled in the art will recognize that the support circuits, such as decoders, drivers and sense amplifiers would normally be integrated into a common semiconductor chip in an actual implementation of the memory system. This system is organized into a plurality of rows responsive to an X address input X ADD and a plurality of columns or bit/sense lines B/S responsive to a Y address input Y ADD. Although only four bit/sense lines are illustrated it will be understood by those skilled in the art that any number of bit/sense lines may be utilized. Application of X ADD to an X decoder 12 selects one of N X drivers 14 to provide a select potential on row select or word line X1 ... XN. The energization of a single one of the word lines will allow accessing of all of the memory elements associated with that row of the memory array. During a reading or sensing operation, data associated with the selected row will be detected by sense amplifiers 16 and a data signal associated with one bit/sense line will be gated to output terminal I/O through Y decoder 18 in response to address input signal Y ADD. During a store or write operation, an input information signal applied to terminal I/O is gated through Y decoder 18 and applied to one of sense amplifiers 16 which drives a selected bit/sense line to the proper potential level. Data associated with the unselected sense amplifiers will be returned to their respective bit/sense lines performing a refresh operation. Those skilled in the art will recognize that the use of Y decoder 18 is optional and that a plurality of input/output terminals may be used.

Referring now to FIGS. 1 and 2, the structural aspects of the memory cell will be described. The data retention or storage means of the memory cell is a capacitor coupled to one of several emitter regions associated with a single base/collector junction of a bipolar transistor. The memory array portion of semiconductor chip 10 comprises a buried N+ subcollector region 20 which may be formed on a P-type substrate 22 for isolation and support purposes. Above region 20 is an N-type semiconductor region 24 which acts as the collector region of the bipolar transistor of the memory cell. Formed within N-type region 24 is a P-type pocket or region 26 which forms the base region of the transistor. A plurality of independent emitter regions 28 are formed of N+-type material within base region 26. Overlying each emitter region 28 and spaced therefrom by dielectric layer 30 is a conductive bit/sense line 32. Each pair of N+ regions 28 and bit/sense lines 32 forms a capacitive storage means. A conductive member 34 ohmically contacts base region 26 and provides control signals from X drivers 14 to base pocket 26 in order to select a particular memory cell. The buried subcollector 20 is normally connected to a source of reference potential Vref to provide proper biasing of the base/collector junction 36.

As will be recognized by those skilled in the art, the processing necessary to fabricate such a memory cell may be substantially the same as that necessary to manufacture conventional type vertical NPN bipolar transistors. The use of semiconductor impurity diffusions or ion implantation techniques may be used interchangeably. Dielectric layer 30 may be a homogeneous or multiple layer material selected to obtain the desired capacitance characteristics necessary for the required memory system performance. In forming the memory array area of semiconductor chip 10 it will be seen that only a single collector is required for the entire array area. Overlying collector 24 a plurality of common base regions, each individually selectable by a separate X drive line, control the forward and reverse bias characteristics of the base/collector junction of each transistor. As can be seen by referring to FIGS. 1 and 2, each individual emitter region 28 within a single base region is associated with a different bit/sense line 32, the nth emitter region within each transistor structure being associated with the nth bit/sense line.

Referring now to FIG. 3 there is shown a schematic diagram of a memory cell of the invention which illustrates the charge storage principles involved in the memory cell. Associated with each bit/sense line there is provided a storage capacitor, Cs1–Csn. The upper plate of each storage capacitor is connected to the bit/sense line which, in turn, is coupled to a sense amplifier which either senses the potential on the bit/sense line during reading or provides the driving potential in order to write data into the memory cell during writing. The lower plate of each memory cell is coupled to one terminal of a group of single pole/single throw bilateral conducting switches Sw1–Swn. The other terminal of each switch is connected to a common source of reference potential Vref, which may be ground potential.

The control terminal of each switch is responsive to an X input signal which is normally provided by the X driver circuits. The presence of the X signal causes switches Sw to assume their conductive state simultaneously. If the potential applied to the bit/sense lines at the time the switches are closed are different from Vref, storage capacitors CS will become charged. When the X input signal is removed and the switches are again in an open position, the charge previously placed on the storage capacitor will remain, due to a lack of discharge path, even though the potentials on the bit/sense lines are removed or altered to some other value. Although the electrical network comprising serially connected storage capacitor CSl and switch Swl, between nodes A and B, is electrically indistinguishable as to whether the switch or the capacitor is coupled directly to Vref, it is exceedingly important to the subject invention that one of the conductive electrodes of the switching element be coupled directly to Vref.

FIG. 4 is an electrical circuit schematic diagram of the memory cell of FIGS. 2 and 3 and comprises a multi-emitter bipolar transistor wherein each of the emitters is independently coupled through a storage capacitor Cs to a bit/sense line B/S. By applying a positive pulse to the selected X drive line, in this example of an NPN transistor, the inverse beta of the multi-emitter transistor will clamp one plate of all the capacitors to within a few millivolts of the potential on the collector electrode attached to Vref. A current limiting resistor may be utilized to prevent excessive current from flowing through the selected devices. High or low potentials may be placed on bit/sense lines B/S in order to establish a particular charge condition on storage capacitors Cs representing logical 1's and 0's. Before bit/sense lines B/S are returned to their quiescent state, the base collector junction is reverse biased by returning the X drive input to a reverse bias potential allowing the transistor to recover from saturation. The bit/sense lines are then returned to their quiescent state. in order to sense the information stored in a storage capacitor Cs, the base/collector junction is again forward biased by energizing the X driver input to the base region which causes storage capacitors to either be charged or not charged depending upon their previous state. If the base/emitter capacitance Cbe is comparable in size to the storage capacitor Cs, helpful phenomenon occurs. For storage capacitors which are charged to a high state, the sense signal will be positive and for capacitors which are charged to a low state the sense signal will be negative. Depending upon the type of sense amplifier used, additional charge coupling may occur through Cbe causing other transients on the bit/sense line.

Referring to FIG. 5 there is shown a memory system in which the memory cells of the instant invention are organized in a 2 ½D organization. The system comprises a plurality of multi-bit memory cells 40 substantially identical to the cells described in connection with FIGS. 3 and 4, each of which are individually addressable by the coincidence of X and Y drive signals provided by X decode and drive circuits 42 and Y decode and drive circuits 44. Circuits 42 and 44 are of conventional design and they need not be described in detail. In order to insure that the base/collector junction of the bipolar transistor is maintained in a reverse biased condition, each Y drive line, is connected to a pull-up circuit such as, for example, bias potential Vb and resistor R1. Because it is necessary to drive the bit/sense lines B/S to different potentials when writing data into a memory cell, it is necessary to isolate bit/sense lines associated with the unselected y drive lines. This is accomplished in the present embodiment by utilizing two different sets of sense/refresh amplifiers 46 and 48. Those skilled in the art will also recognize that various multiplexing circuits or gating circuits may be utilized to gate the selected bit/sense lines associated with one Y drive line to a single multi-bit sense/refresh amplifier.

Figure 6A:
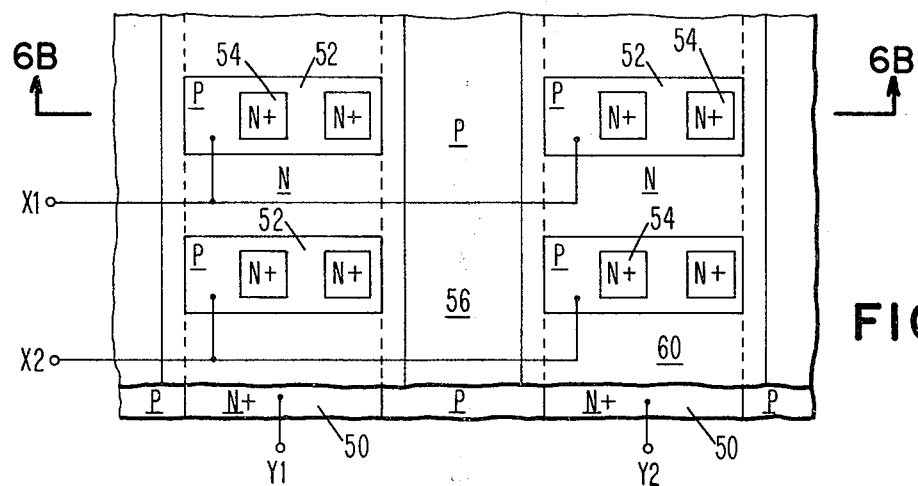
FIGS. 6A and 6B shown a partial plan and cross-sectional view of a typical integration technique for forming the memory cells of the system shown in FIG. 5 prior to the formation of the storage capacitors.
Figure 6B:
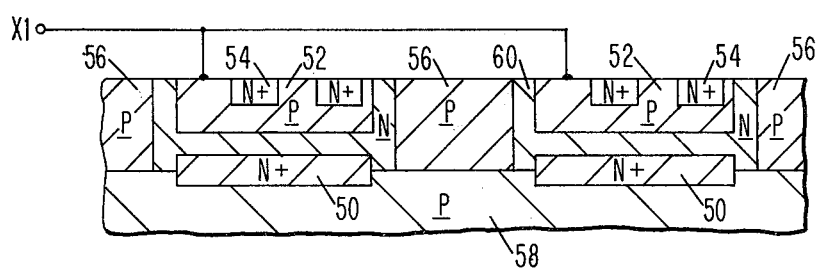

Referring to FIGS. 6A and 6B, there is shown a schematic partial plan and sectional view of a typical integrated embodiment of memory cells usable in the system of FIG. 5. For ease of explanation, the bit/sense lines, which run parallel to the Y lines, have not been shown. For each column of addressable memory cells there is provided an isolated buried subcollector N+ region 50. Directly overlying regions 50 and organized into columns and rows are a plurality of P-type semiconductor material pockets 52 which form the base region of each bipolar switching transistor. Each P-type region 52 has provided within it a plurality of isolated N+ emitter regions 54. Isolation between columns of cells is provided by a P-type region 56.

The integrated memory array structure shown in FIGS. 6A and 6B may be fabricated utilizing conventional bipolar processing technology in which a P-type semiconductor starting wafer 58 is utilized. Buried subcollector regions 50 are initially deposited or diffused into wafer 58 and an N-type epitaxial layer 60 is grown thereon. Isolation regions 56 may be fabricated simultaneously with regions 50 and layer 60 or may be formed at a later point in the process, for example, by ion implantation. Base regions 52 and emitter regions 54 may be formed by diffusion or equivalent techniques.

The memory cell of FIGS. 6A and B operates in a similar manner to the cell of FIGS. 3 and 4 with the exception that in order to provide coincident selection the forward and reverse biasing potentials for the base/collector regions are provided through both X and Y drive lines as opposed to utilizing the X drive line alone.

Figure 7:
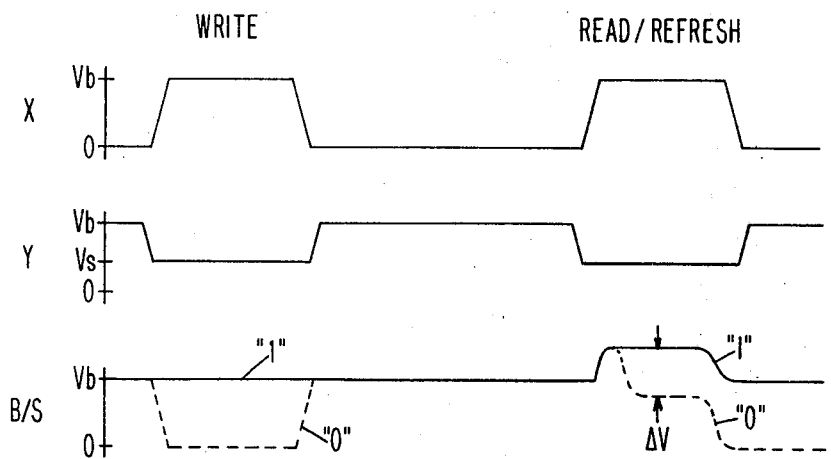
FIG. 7 is a pulse program which may be used to operate the memory system of FIG. 5.

FIG. 7 shows a typical pulse program for operating the memory cell of FIGS. 6A and 6B. During the standby, or unselected state, the X drive line is maintained at, for example, 0 volts potential and the Y drive and bit/sense lines are maintained at a bias potential Vb of, for example, +1.5 volts. Under these applied voltage conditions it will be seen that the base collector junction of the bipolar switching transistor is maintained in a reverse biased condition. During the active, or selected state, for either reading or writing, the base/collector junction is forward biased to cause transistor action by applying bias voltage Vb to the X drive line and by applying a select potential Vs of, for example, about 0.8 volts, to the Y drive line. A separate power supply potential is not necessary for providing Vs, as it may be generated through a voltage divider. These voltage conditions provide transistor action and render the transistor conductive for both read and write conditions. In order to write a logical 1, the bit/sense line B/S for the selected bit to be written is held at Vb. Since the emitter is clamped at substantially Vs, storage capacitor Cs will be charged to about −0.7 volts with respect to the bit/sense line potential. This charged condition will be sustained when the base/collector junction is again reverse biased after the X drive line returns to 0 volts due to the isolation of the emitter region. In order to write a logical 0 state, the selected bit/sense line is forced to 0 volts which causes storage capacitor Cs to assume a positive charge with respect to the bit/sense line of about 0.8 volts. During a read operation the X and Y drivers again provide a forward bias condition for the base/collector junction while the bit/sense line is left floating at Vb. If a logical 1 had previously been written into the cell, that is, the storage capacitor Cs has been charged to −0.7 volts, the application of forward bias to the base/collector junction will again apply approximately 0.8 volts to the isolated emitter region. Since the storage capacitor is already charged, no substantial charging or discharging takes place. However, the positive transition of the X drive potential will cause a small positive output signal to be coupled through Cs to the bit/sense line through the base/emitter capacitance. if a logical 0 had been previously written into the storage cell, the application of Vb to the bit/sense line during the standby state will have caused the emitter region to have increased in potential to approximately 2.2 volts. After the X and Y drivers forward bias the base/collector junction, the emitter region will be discharged to approximately 0.8 volts causing a negative transient on the floating bit/sense line. The voltage difference Δv may be sensed by a sense amplifier which then drives the bit/sense line to either Vb or 0 volts causing the data in the storage cell to be rewritten or refreshed. Although voltage sensing of the bit/sense line while in a floating condition is preferred, those skilled in the art will recognize that current sensing as well as different read/write cycle timings may also be utilized.

Although conventional bipolar integration techniques are preferred, the subject invention may be fabricated by using other semiconductor technologies, as illustrated in the following examples.

Figure 8:
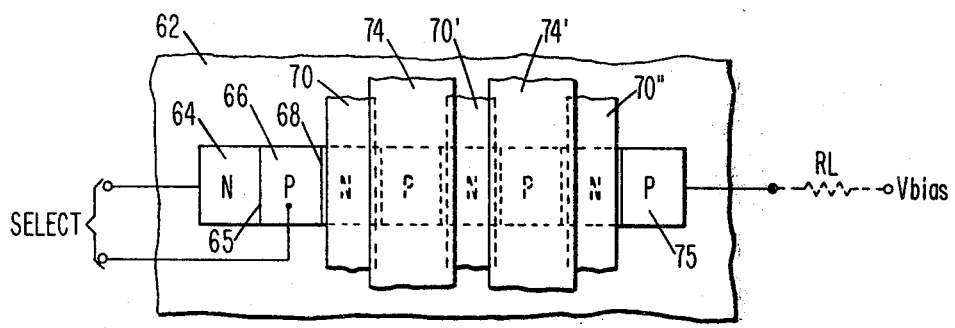
FIGS. 8 and 9 are a schematic representation of the plan and elevation views of an alternative embodiment of the invention using semiconductor-on-insulator technology in which each of a plurality of alternating P- and N-type regions are associated with a storage capacitor.
Figure 9:
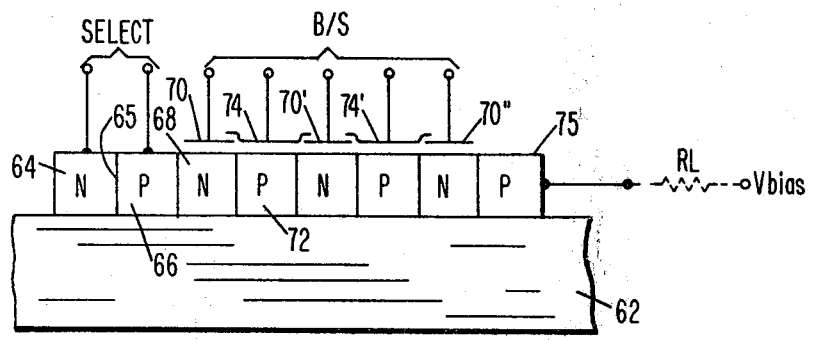

Referring now to FIGS. 8 and 9, there is shown, respectively, a schematic plan and elevation view of an embodiment of the invention formed on an insulating substrate. There is provided an insulating substrate 62, of, for example, sapphire, upon which are formed a plurality of alternating N and P-type semiconductor regions. N-type region 64 and P-type region 66 form the base/collector junction 65 of an NPN transistor having an emitter comprising N-type region 68. Capacitively coupled to emitter region 68 is one of a plurality of first bit/sense lines 70. contacting and forming another PN junction with emitter region 68 is a second P-type region 72. Those skilled in the art will recognize that the application of a forward biasing potential to base/collector junction 65 will also provide a forward bias condition to each of the other P/N junctions along the length of the structure. Conductive bit/sense line 74 is capacitively coupled to P-type emitter 72 of the PNP bipolar transistor comprised of regions 66, 68, 72. In a similar manner, additional capacitive storage means are created by applying additional capacitively coupled bit/sense lines over each of the P and N-type regions except P-type region 75, which is preferably coupled to a reference voltage V bias through a load resistor RL. Because of the use of alternating conductivity type zones as the emitters of alternating NPN and PNP bipolar transistors, it is necessary to utilize opposite polarity driving pulses and reference potentials on each of the two sets of bit/sense lines 70 and 74. In fabricating the structure of FIGS. 8 and 9, it is preferred to use the two different levels of metallurgy to form bit/sense lines 70 and 74. Bit/sense line 70 may be fabricated from conductive material such as silicon which may be oxidized to form a self isolating conductor. Bit/sense line 74 may be formed of any conductive material, for example, aluminum, and applied in overlapping fashion over bit/sense lines 70. It will be noted that maximum density can be achieved in the memory cell arrray area because of the use of essentially all of the semiconductor material as storage nodes.

It will also be recognized by those skilled in the art that various structures formed in semiconducting substrates may also be formed on insulating substrates.

Figure 10A:
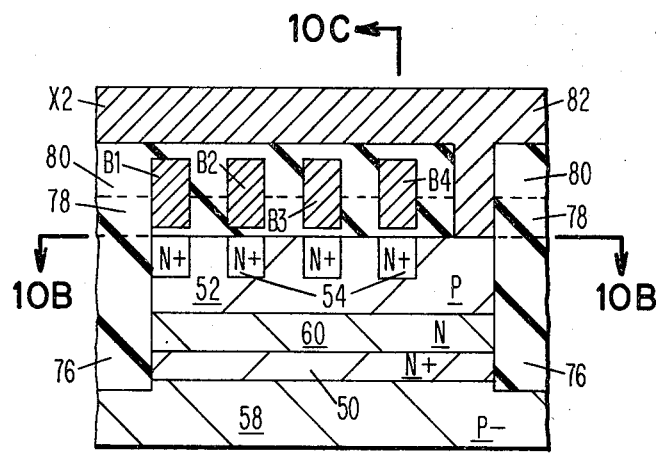
FIGS. 10A, B, and C are sectional views of an alternative integration technique useful to fabricate memory cells of the subject invention.
Figure 10C:
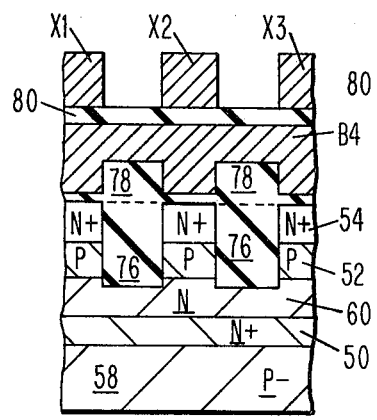
Figure 10B:
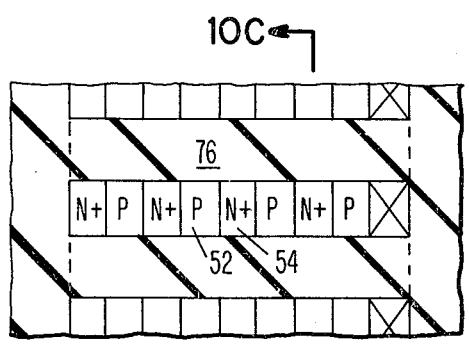

Referring now to FIGS. 10A, B and C, there is shown sectional views of another embodiment of a preferred integration technique for fabricating the memory cells in accordance with the teachings of the subject invention. This cell is similar to the one described in FIGS. 6A and 6B and may also be utilized in the 2 ½D selection system of FIG. 5. Like reference numbers are used to indicate common elements found in the structure of FIGS. 6A and 6B. Referring to FIGS. 10A and 10C, there is provided a P- semiconductor substrate 58 upon which sequentially are provided: N+ sub/collector region 50, N collector region 60, P base region 52 and a plurality of N+ emitter regions 54. In order to provide electrical isolation between adjacent memory cells, there is provided, preferably by a reoxidation technique, a dielectric material 76 which may be silicon dioxide. Overlying dielectric material 76 is a second layer of insulating material 78 of which a portion of which is utilized to form the capacitor dielectric for each storage capacitor. As previously described, each one of the N+ emitter regions 54 forms one plate of a storage capacitor while a conductive bit line (B1-4) forms the other plate of the storage capacitor. Overlying the bit/sense lines is a third insulating material layer 80 which serves to insulate the bit/sense lines from the X drive lines 82 which are formed of a second metallurgical layer in ohmic contact to base region 52 through a via hole. FIG. 10B is a sectional view of the structure in FIG. 10A taken along the lines 10B and shows the isolated emitter regions 54 and the common P-type base region 52 as well as the ohmic contact interface region between base region 52 and X drive line 82. FIG. 10C illustrates a sectional view taken along the lines 10C of FIG. 10A and more clearly shows the continuous sub/collector region 50 which is common to a plurality of different memory cells corresponding to X drive lines X1, X2, and X3.

Figure 11A:
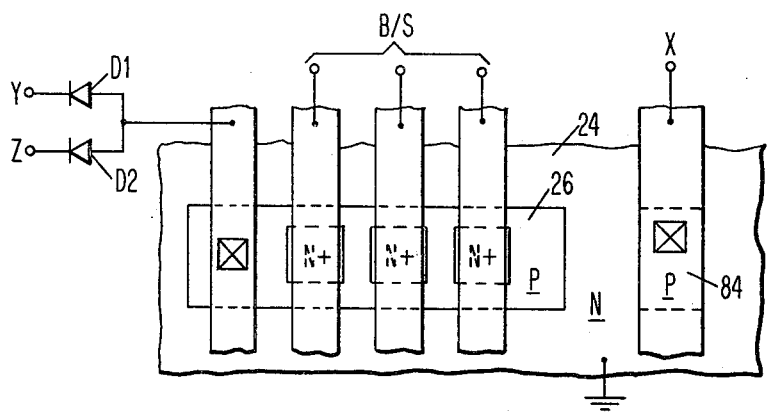
FIGS. 11A and B are plan and sectional views of yet another embodiment of the invention suitable for organization in a 3D memory system which uses the principles of Merged Transistor Logic.
Figure 11B:
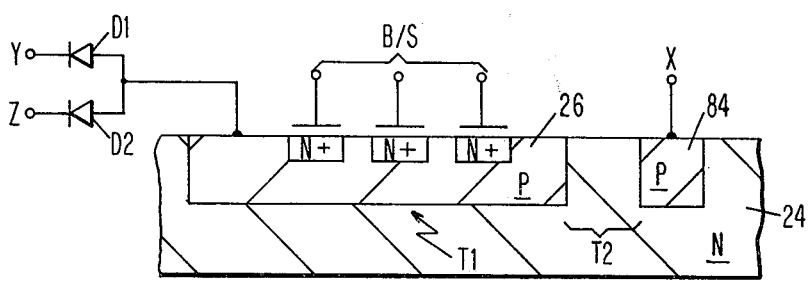

Referring now to FIGS. 11A and 11B, there is shown another structural embodiment of the subject invention which may be utilized to form a three-dimensionally accessed memory array. U.S. Pat. No. 3,736,477, issued May 29, 1973, to H. H. Berger et al, and assigned to the assignee of the instant invention, describes a bipolar logic technology in which lateral and vertical transistors are used jointly. This technology is commonly referred to as merged transistor logic and provides increased density over more conventional bipolar logic technologies. The memory cell of FIG. 11A and 11B is fabricated using merged transistor logic technology. A multi-bit memory cell substantially the same as that shown in FIG. 2 is provided in P-type semiconductor pocket 26 of N-type semiconductor material 24 to form NPN transistor T1 which forms the multi-bit storage cell. A lateral PNP transistor is formed by utilizing an isolated P-type region 84 formed adjacent to P-type pocket 26. The portion of N-type material 24 lying between the two P regions forms the base region of lateral transistor T2. The application of an X drive signal to isolated P-type region 84 provides drive current to transistor T1 in the event that one of the diodes D1 or D2 or not forward biased. The mult-bit memory cell will be selected upon the occurrence of an X input signal and the absence of both the Y and the Z input signals.

Figure 12:
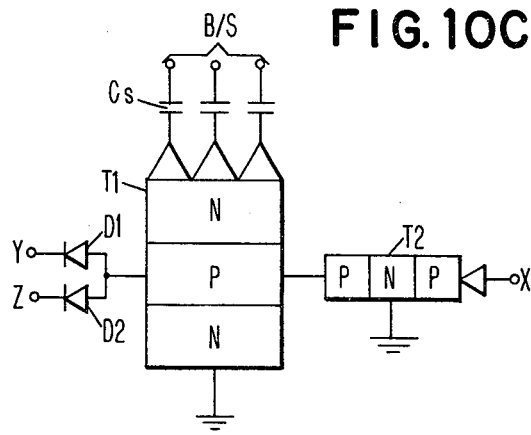
FIG. 12 is an equivalent circuit diagram of the memory cell shown in FIG. 11.

FIG. 12 is a schematic circuit diagram showing the multi-emitter NPN transistor T1 and the lateral PNP transistor T2.

Those skilled in the art will recognize that in all of the above embodiments the use of a bipolar transistor to provide switching action not only provides an increase in speed inherent in bipolar technologies but allows a configuration in which a common switching element may be utilized to control a multiple number of separately addressable storage capacitors. In addition, the simplification of the drive pulses necessary to operate the memory cell of the invention will also be appreciated in that only two power supply potentials are necessary in order to operate the memory. The avoidance of the detrimental use of avalanche or junction breakdown conditions in the subject invention provides an improvement in reliability over previously described diode/capacitor memory cells.

Although the invention has been described utilizing NPN bipolar transistors, those skilled in the art will recognize that PNP transistors may also easily be utilized.

While the invention has been described with respect to specific embodiments disclosed herein, it will be understood that these are merely illustrative of several of the many forms which the invention may take in practice and that numerous additional modifications thereof will readily occur to those skilled in the art without departing from the scope of the invention.

What is claimed is:

1. An information storage system including a plurality of addressable memory cells, each of said memory cells comprising:
    a plurality of two terminal capacitive storage elements;
    a plurality of bit/sense means coupling one terminal of each of said capacitive storage elements independently to an information input and output means; and
    switching means, responsive to a memory cell accessing signal, for unconditionally causing the other terminal of each of said capactive storage elements to be simultaneously coupled to a predetermined reference potential.

2. The information storage system of claim 1 wherein said switching means comprises a bipolar transistor.

3. The information storage system of claim 2 wherein said bipolar transistor includes a base, a collector and a plurality of emitters, each of said emitters forming said other terminal of said capacitive storage element.

4. The information storage system of claim 3 wherein said base is directly coupled to a source of accessing signals.

5. The information storage system of claim 4 wherein said collector is directly coupled to a source of accessing signals.

6. The information storage system of claim 5 wherein said bipolar transistor and said capacitive storage element are vertically aligned.

7. The information storage system of claim 6 wherein the junction capacitance between said base and each of said emitters is substantially equal in magnitude to the capacitance of one of said capacitive storage elements.

8. The information storage system of claim 1 wherein said switching means comprises a plurality of semiconductor regions of alternating first and second conductivity types forming a plurality of isolated metallurgical junctions, and further wherein said bit/sense lines are coupled to at least a plurality of said semiconductor regions of said first conductivity type and said accessing signal is applied between two adjacent regions to cause all of said metallurgical junctions to become forward biased.

9. The information storage system of claim 8 wherein at least some of said bit/sense lines are coupled to at least some of said regions of second conductivity type.

10. In an information storage system having a plurality of addressable memory cells coupled to a plurality of bit/sense lines, each memory cell comprising:
    a transistor having a collector, a base and a plurality of emitters;
    an information signal storing capacitor coupled between each of said emitters and a separate one of said bit/sense lines; and
    memory cell accessing means coupled to said collector and base for unconditionally causing transistor action in said transistor when said cell is addressed.

11. The information storage system of claim 10 wherein said collector is coupled to a fixed reference potential.

12. The information storage system of claim 10 wherein said memory cell accessing means comprises first and second addressing signals coupled, respectively, to said base and collector.

13. The information storage system of claim 10 wherein said memory cell accessing means comprises first address signal responsive means for selectively providing base current to said transistor and second address signal responsive means for selectively coupling said base current to a source of reference potential to prevent transistor action in said transistor when said memory cell is to be unselected.

14. The information storage system of claim 13 wherein said transistor is of a first conductivity type and said first address responsive means is a lateral bipolar transistor of a second conductivity type.

15. The information storage system of claim 14 wherein said second address signal responsive means comprises a diode.

16. An information storage system including a plurality of memory cells, each memory cell comprising:
    a plurality of bit/sense lines for transferring information signals to and from said memory cell;
    a plurality of first semiconductor regions of a first conductivity type, each of said first semiconductor regions forming at least one first PN junction with at least one second semiconductor region of a second conductivity type;
    a capacitive storage means associated with each of said first semiconductor regions, for storing information signals, each of said capacitive storage means being coupled to one of said bit/sense lines;
    a third semiconductor region of said first conductivity type forming a second PN junction with said one second semiconductor region; and
    means coupled to said bit/sense lines for sensing the presence of current flowing between each of said first semiconductor regions and said third semiconductor region when said second PN junction is forward biased, said current being representative of information signals stored in said capacitive storage means.

17. The information storage system of claim 16 wherein each of said first semiconductor regions forms two separate first PN junctions with different ones of a plurality of said second semiconductor regions and said memory cell accessing means applies said biasing potentials directly to only said one second semiconductor region and said third semiconductor region.

18. The information storage system of claim 17 further including additional capacitive storage means coupled to at least some of said second semiconductor regions.

19. The information storage system of claim 18 wherein said semiconductor regions are formed on an insulating substrate.

20. The information storage system of claim 16 wherein there is provided only one second and one third semiconductor region and said first and second PN junctions are formed in a substantially vertical arrangement.

21. The information storage system of claim 20 wherein the junction capacitance of said first PN junctions is substantially equal in magnitude to the capacitance of said capacitive storage means.

22. In an integrated semiconductor memory system containing a plurality of addressable cells, each cell comprising:

a substrate containing a first region of first conductivity type material;

a second region of second conductivity type material forming a metallurgical junction with said first region;

a plurality of third regions of said first conductivity type material formed within said second region and forming a plurality of separate metallurgical junctions therewith;

a plurality of conductive members, each one of said conductive members being associated with, and insulatingly spaced from, one of said third regions; and accessing means for applying a forward bias voltage between said first and second regions to cause each of said third regions to be coupled to a reference potential whenever said memory cell is to be accessed.

23. The memory system of claim 22 wherein said first region of first conductivity type material is common to a plurality of said memory cells.

24. The memory system of claim 23 wherein each of said conductive members is associated with and insulatingly spaced from one of said third regions in each of said plurality of memory cells.

25. The memory system of claim 22 wherein the capacitance of said metallurgical junctions formed by said second and third regions is substantially equal in magnitude to the capacitance between each of said third regions and each of said conductive members.

* * * * *